US011450535B2

(12) United States Patent
Kwon et al.

(10) Patent No.: US 11,450,535 B2
(45) Date of Patent: Sep. 20, 2022

(54) MANUFACTURING METHOD FOR SEMICONDUCTOR PACKAGE INCLUDING FILLING MEMBER AND MEMBRANE MEMBER (71) Applicant: NEPES CO., LTD., Chungcheongbuk-do (KR)

(72) Inventors: Yong-Tae Kwon, Cheongju-si (KR); Jun-Kyu Lee, Cheongju-si (KR); Si Woo Lim, Daegu (KR); Dong-Hoon Oh, Seoul (KR); Jun-Sung Ma, Seoul (KR); Tae-Won Kim, Cheongju-si (KR)

(73) Assignee: NEPES CO., LTD., Chungcheongbuk-Do (KR)

( * ) Notice: Subject to any disclaimer, the term of this patent is extended or adjusted under 35 U.S.C. 154(b) by 0 days.

(21) Appl. No.: 16/090,602

(22) PCT Filed: Apr. 3, 2017

(86) PCT No.: PCT/KR2017/003644
§ 371 (c)(1),
(2) Date: Oct. 2, 2018

(87) PCT Pub. No.: WO2017/176020
PCT Pub. Date: Oct. 12, 2017

(65) Prior Publication Data
US 2019/0122899 A1    Apr. 25, 2019

(30) Foreign Application Priority Data
Apr. 4, 2016    (KR) .................... 10-2016-0041141

(51) Int. Cl.
*H01L 21/56*    (2006.01)
*H01L 21/683*    (2006.01)
(Continued)

(52) U.S. Cl.
CPC ............ *H01L 21/56* (2013.01); *H01L 21/563* (2013.01); *H01L 21/6835* (2013.01);
(Continued)

(58) Field of Classification Search
CPC ............. H01L 21/563; H01L 2021/603; H01L 2224/83986; H01L 2224/83047; H01L 2224/81986; H01L 2224/1191
See application file for complete search history.

(56) References Cited

U.S. PATENT DOCUMENTS 8,008,122 B1 * 8/2011 Gaynes ................... H01L 24/75
 438/107
8,288,869 B2 * 10/2012 Huang .................. H01L 21/486
 257/773
(Continued)

FOREIGN PATENT DOCUMENTS

JP    2005-166902 A    6/2005
JP    2005-481956    *    6/2005
(Continued)

OTHER PUBLICATIONS

International Search Report (ISR) for International Application No. PCT/KR2017/003644.
(Continued)

*Primary Examiner* — Daniel Luke
(74) *Attorney, Agent, or Firm* — Ladas & Parry LLP (57) ABSTRACT A semiconductor package comprising a fan-out structure and a manufacturing method therefor are disclosed. A semiconductor package according to an embodiment of the present invention comprises: a wiring unit comprising an insulation layer and a wiring layer; a semiconductor chip mounted on the wiring unit and coupled to the wiring layer by flip-chip bonding; a filling member for filling a gap between the semiconductor chip and the wiring unit; and a film member
(Continued)

for performing coating so as to cover one surface of each of the semiconductor chip, the filling member, and the wiring unit.

4 Claims, 7 Drawing Sheets

(51) Int. Cl.
*H01L 23/31* (2006.01)
*H01L 23/498* (2006.01)
*H01L 23/552* (2006.01)
*H01L 23/522* (2006.01)
*H01L 23/525* (2006.01)

(52) U.S. Cl.
CPC ............ *H01L 23/31* (2013.01); *H01L 23/498* (2013.01); *H01L 23/522* (2013.01); *H01L 23/525* (2013.01); *H01L 23/552* (2013.01); *H01L 23/3128* (2013.01); *H01L 2221/68345* (2013.01); *H01L 2224/16225* (2013.01); *H01L 2224/73104* (2013.01); *H01L 2224/73204* (2013.01); *H01L 2224/81005* (2013.01); *H01L 2224/81191* (2013.01); *H01L 2224/83203* (2013.01); *H01L 2224/83856* (2013.01); *H01L 2224/83986* (2013.01); *H01L 2924/15311* (2013.01); *H01L 2924/3025* (2013.01)

(56) References Cited

U.S. PATENT DOCUMENTS

| | | | | |
|---|---|---|---|---|
| 10,280,347 | B2* | 5/2019 | Kubota | .................. C08G 59/42 |
| 2012/0241949 | A1* | 9/2012 | Sasaki | ................ H01L 25/0657 |
| | | | | 257/737 |

FOREIGN PATENT DOCUMENTS

| | | | |
|---|---|---|---|
| KR | 10-2008-0077177 A | | 8/2008 |
| KR | 10-2012-0053332 A | | 5/2012 |
| KR | 10-2013-0069438 A | | 6/2013 |
| KR | 10-2015-0047167 A | | 5/2015 |
| KR | 20150047167 A | * | 5/2015 |

OTHER PUBLICATIONS

Written Opinion (WO) for International Application No. PCT/KR2017/003644 dated Jul. 21, 2017.
KR 10-2015-0047167 A _ English_Abstract.
KR 10-2013-0069438 A _ English_Abstract.
KR 10-2012-0053332 A _ English_Abstract.
JP 2005-166902 A—English Abstract.
KR 10-2008-0077177 A _ English_Abstract.

* cited by examiner

MANUFACTURING METHOD FOR SEMICONDUCTOR PACKAGE INCLUDING FILLING MEMBER AND MEMBRANE MEMBER

RELATED APPLICATION

This application is a national phase entry under 35 USC 371 of International Patent Application No.: PCT/KR2017/003644 filed on 3 Apr. 2017, which claims priority from Korean Application No. 10-2016-0041141 filed on 4 Apr. 2016, the disclosures of which are incorporated in their entirety by reference herein.

BACKGROUND

1. Field

The present disclosure relates to a semiconductor package and a method of manufacturing the same, and more specifically, to a semiconductor package including a fan-out structure and a method of manufacturing the same.

2. Description of the Related Art

In recent years, as semiconductor devices are being reduced in chip size and the number of input/output terminals due to miniaturization of process technology and diversification of functions, the pitch of electrode pads is getting smaller, combination of more various functions is being accelerated, and thus a system-level packaging technology for integrating a number of devices into a package is emerging. System-level packaging technology is also being transformed into a three-dimensional stacking technique that maintains a short signal distance to improve a signal speed while minimizing signal-to-noise.

Meanwhile, in order to satisfy such a demand for technological improvement and control the rise in the product price, a stacked semiconductor package including a plurality of semiconductor chips or a system in package (SIP) in which semiconductor chips having different functions are integrated is implemented to increase the productivity and the manufacturing cost.

Meanwhile, in the case of the conventional semiconductor packages having a fan-out structure, separated individual semiconductor chips are rearranged on a separate large-diameter panel, are molded by epoxy molding compound (EMC) to be integrated with each other, and then are subject to a build-up process to form interconnect circuits on the surface of a semiconductor chip pad.

However, due to a flow of EMC or thermal deformation occurring during the EMC molding, the semiconductor chip may be unintentionally moved, which is referred to as a drift. Such a movement of the chip causes misalignment between the chip pad and the circuit formed in the build-up process, and causes difficulty in coping with a fine pitch of the pad.

In addition, the structure to seal the semiconductor with EMC to protect the semiconductor chip causes a difficulty in dissipating heat due to EMC having high thermal resistance.

Meanwhile, a flip chip Ball Grid Array (BGA) package uses a process of individually packaging semiconductor chips, and thus has a low productivity and a high product price compared to the wafer level packaging. In addition, the flip chip BGA package has a difficulty in designing and manufacturing a substrate suitable for coping with a fine pad pitch and leads to rise in the price of the substrate.

SUMMARY

Therefore, it is an object of the present disclosure to provide a semiconductor package having a thin thickness and a fine pitch of the package, and a method of manufacturing the same.

It is another object of the present disclosure to provide a semiconductor package capable of removing constraints of the productivity in a process of separately packaging individual semiconductor chips.

Additional aspects of the invention will be set forth in part in the description which follows and, in part, will be obvious from the description, or may be learned by practice of the invention.

Therefore, it is an aspect of the present invention to provide a semiconductor package including: an interconnect portion including an insulating layer and an interconnect layer; a semiconductor chip mounted on the interconnect portion and coupled to the interconnect layer by a flip chip bonding; a filling member filling between the semiconductor chip and the interconnect portion; and a membrane member coated to cover one surfaces of the semiconductor chip, the filling member, and the interconnect portion.

The interconnect portion may include a first interconnect layer connected to the semiconductor chip, a first insulating layer insulating the first interconnect layer, and a substrate connected to the first interconnect layer; the substrate includes a second interconnect layer connected to the first interconnect layer and a second insulating layer that insulates the second interconnect layer; and the second insulating layer has a plurality of via holes that exposes the second interconnect layer.

The semiconductor package may further include an external connection terminal connected to the second interconnect layer through the blind via holes, wherein the interconnect portion and the external connection terminal may expand an active region of the semiconductor chip to the outside to form a fan-out structure.

The first interconnect layer may form a redistribution layer, and may include a connection region connected to a signal portion of the semiconductor chip and an expansion region that may expand the connection region to the outside to be located at an outer side of the semiconductor chip, wherein the membrane member may be provided to simultaneously cover the semiconductor chip and the expansion region.

The filling member may be filled by underfilling an active surface of the semiconductor chip.

The membrane member may be a shielding membrane that shields electro-magnetic interference (EMI).

The membrane member may be formed of material including at least one of ceramic, plastic, tempered glass, or metal.

The semiconductor package may further include a sealing material that seals one surface of the membrane member.

It is another aspect of the present invention to provide a method of manufacturing a semiconductor package, the method including: forming an interconnect portion including an interconnect layer and an insulating layer; preparing a semiconductor chip having an active surface thereof underfilled by a filling member such that a bump protruding from the active surface is sealed; mounting the semiconductor chip on the interconnect portion such that the bump is connected to the interconnect layer by pressing the semiconductor chip at a high temperature; and coating a membrane member to seal the semiconductor chip and the interconnect layer.

The forming of the interconnect portion may include: preparing an insulating substrate including a second insulating layer and a second interconnect layer stacked on the second insulating layer in which the second insulating layer is formed with a plurality of blind via holes that expose the second interconnect layer; disposing the insulating substrate on a carrier such that the blind via holes face the carrier; forming a pattern on the second interconnect layer; stacking a first insulating layer on the second insulating layer while exposing a part of the patter of the second interconnect layer; and forming a first interconnect layer connected to the second interconnect on the first insulating layer, wherein the bump may be connected to the first interconnect layer, the membrane member may be coated to seal the first interconnect layer.

The filling member may be underfilled in a state of B-stage, and may be cured after the semiconductor chip is mounted on the interconnect portion.

The semiconductor chip may be cut in units of packages after the filling member is underfilled in a wafer level; and the semiconductor chip cut in units of package may be mounted on the interconnect portion.

The method may further include: forming a metal clad layer inside the blind via hole to be connected to the second interconnect layer before disposing the substrate on the carrier; removing the carrier after sealing of the membrane member; and attaching an external connection terminal to the metal clad layer that is exposed when the carrier is removed.

BRIEF DESCRIPTION OF THE DRAWINGS

These and/or other aspects of the invention will become apparent and more readily appreciated from the following description of the embodiments, taken in conjunction with the accompanying drawings of which:

FIGS. 2 to 13 are views illustrating a process of fabricating the semiconductor package according to the first embodiment of the present disclosure, in which

DETAILED DESCRIPTION

Hereinafter, embodiments of the present disclosure will be described in detail with reference to the accompanying drawings. The following embodiments are provided to fully convey the spirit of the present disclosure to a person having ordinary skill in the art to which the present disclosure belongs. The present disclosure is not limited to the embodiments shown herein but may be embodied in other forms. In order to make the description of the present disclosure clear, unrelated parts are not shown and, the sizes of components are exaggerated for clarity. In the drawings, the same reference numerals may be used to designate the parts and elements performing the same functions throughout the specification. The term "and/or" refers to a combination of a plurality of related, described items or any of the plurality of related, described items.

Figure 1:
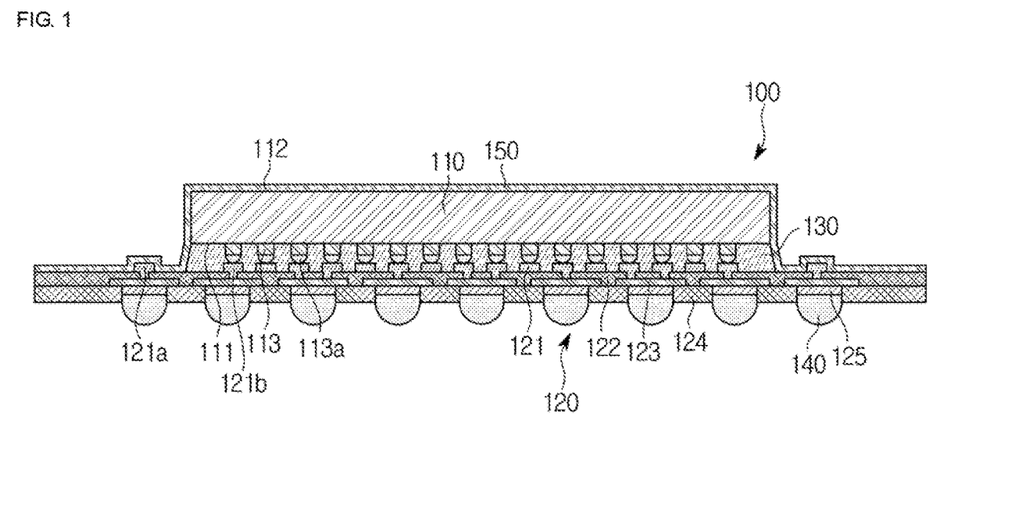
FIG. 1 is a cross-sectional view illustrating a semiconductor package according to the first embodiment of the present disclosure.

FIG. 1 is a cross-sectional view illustrating a semiconductor package 100 according to a first embodiment of the present disclosure.

The semiconductor package 100 according to the first embodiment of the present disclosure includes a semiconductor chip 110, an interconnect portion 120 electrically connected to a lower part of the semiconductor chip 110, a filling member 130 for integrally molding the semiconductor chip 110 and the interconnect portion 120, and an external connection terminal 140 electrically connected to the interconnect portion 120 to connect the semiconductor package 100 an external circuit (not shown).

The semiconductor chip 110 may be an integrated circuit (Die or IC: Integrated Circuit). Alternatively, the semiconductor chip 110 may be a memory chip or a logic chip. Examples of the memory chip may include a DRAM, a SRAM, a flash, a PRAM, an ReRAM, an FeRAM, or an MRAM. Examples of the logic chip may be a control device for controlling memory chips.

Although only one semiconductor chip 110 is illustrated in the drawing, a plurality of semiconductor chips (not shown) may be provided in one package. The plurality of semiconductor chips may be provided in the same type or may be in different types. For example, a package in which a plurality of semiconductor chips are provided in different types but are electrically connected to each other to operate as a single system is a system-in-package (SIP). In one example, a semiconductor chip in the package may be an integrated circuit, and another semiconductor chip may be an active device or a passive device.

The semiconductor chip 110 may have an active surface 111 including an active region in which a circuit is formed. The opposite surface of the active surface 111 may be an inactive surface 112. The active surface 111 may have a signal portion 113 for exchanging signals with the outside.

In the drawings, the signal portion 113 is illustrated as a bump attached to one surface of the semiconductor chip 110. For example, the signal portion 113 may be a copper pillar bump or a solder bump.

Alternatively, the signal portion 113 may be a signal pad integrally formed with the semiconductor chip 110. In this case, one surface of the signal portion 113 may form the same plane together with the active surface 111.

The signal portion 113 may be electrically connected to the interconnect portion 120. A conductive adhesive material 113a may be applied to one side of the signal portion 113 for connection with the interconnect portion 120. For example, the connection between the signal portion 113 and the interconnect portion 120 may be a solder joint bonding by a molten material of a metal (including lead (Pb) or tin (Sn)).

The interconnect portion 120 may electrically connect the semiconductor chip 110 to an external connection terminal 140 which will be described later. The interconnect portion may be manufactured using a core substrate having a blind via. A process of fabricating the interconnect portion will be described later.

In addition, the substrate constituting the interconnect portion 120 may perform various functions depending on a material forming the interconnect portion that is selected as necessary. The substrate may be formed of a material having high thermal conductivity, a material capable of shielding electromagnetic interference (EMI), or a material having high strength or high hardness. The substrate may be formed of a material including at least one of ceramic, plastic, tempered glass, metal, or the like. For example, the substrate may be formed of a polymer-based material to ensure flexibility, a metal material to ensure a rigidity, or a ceramic-based material to improve heat dissipation performance.

The interconnect portion 120 may be formed by a redistribution process of a metal interconnect. For example, the metal interconnect of a micro pattern may be formed on one surface of the core substrate using a photoresist process and a plating process.

The interconnect portion 120 may include interconnect layers 121 and 123, a metal clad layer 125, an insulating layer 122, and an insulating substrate 124. The interconnect layers 121 and 123 and the metal dad layer 125 include a conductive material, for example, metal. As an example, the interconnect layers 121 and 123 may include copper, aluminum, or an alloy thereof, and the metal clad layer 125 may be a conductive resin.

The insulating layer 122 and the substrate 124 may include organic or inorganic insulating materials. In one example, the insulating layer 122 and the substrate 124 may include an epoxy resin.

The interconnect portion 120 may be provided in three layers or two layers. For example, the interconnect portion 120 may include the first and second interconnect layers 121 and 123 electrically to each other, the metal clad layer 125, the insulating layer 122 for insulating the first and second interconnect layers 121 and 123 and the metal clad layer 125, and the insulating layer 122. The insulating layer 122 may be formed of an insulating material.

The first interconnect layer 121 may be connected to the signal portion 113 of the semiconductor chip 110, the second interconnect layer 123 may be connected to the first interconnect layer 123, and the metal clad layer 125 may be connected to the external connection terminal 140, which will be described later. The first and second interconnect layers 121 and 123 may be formed on the insulating layer 122 and the substrate 124 by a metal patterning method, and the metal clad layer 125 may be formed on the substrate 124 by a metal patterning method.

In addition, the insulating layer 122 may be formed of a dielectric coating, and the substrate 124 may be provided with the via hole 124a formed therein.

The interconnect portion 120 may allow the semiconductor chip 110 to be redistributed to form a circuit. That is, the semiconductor chip 110 is redistributed by the interconnect portion 120, so that the semiconductor package 100 has a fan-out structure. Accordingly, input/output terminals of the semiconductor chip 110 may be miniaturized and the number of input/output terminal may be increased.

The filling member 130 may be molded to integrate the semiconductor chip 110 and the interconnect portion 120 together. The filling member 130 may be filled between the semiconductor chip 110 and the interconnect portion 120. One side of the filling member 130 may support the active surface 111 of the semiconductor chip 110 and the other side of the filling member 130 may support one side of the interconnect portion 120. The filling member 130 may fill between the plurality of signal portions 113 and may fill between the plurality of first interconnect layers 121.

In addition, the filling member 130 may include an insulating material. For example, the filling member 130 may be provided as an epoxy based material.

In addition, the filling member 130 may be filled in the form of an underfill. Underfill refers to a form of filling that covers the active surface 111 of the semiconductor chip 110. For example, the filling member 130 may be provided using epoxy flux paste underfilled.

In addition, the filling member 130 may be provided using a thermally conductive EMC (or a thermally conductive reinforced resin) having a high thermal conductivity. The heat conduction filling member may quickly discharge heat generated from the semiconductor chip 110 to the outside, thereby preventing the semiconductor chip 110 from overheated.

The filling member 130 may stabilize the structural characteristics of the semiconductor package 100. In addition, the filling member 130 may alleviate the impact of the semiconductor chip 110 due to an external force. In addition, the filling member 130 may absorb the heat emitted from the semiconductor chip 110 or release the heat to the outside. In addition, the filling member 130 may present alignment errors from occurring due to high temperature heat, pressure, or the like generated in the manufacturing process when the plurality of signal portions 113 are arranged at fine pitches.

In addition, the filling member 130 may be provided to support the entire area of one surface of the semiconductor chip 110. That is, the filling member 130 may support the entire area of the active surface 111. In addition, side portions of the filling member 130 have a cross-sectional area that increases as it goes downward. That is, the side portion of the filling member 130 may form an inclined surface with respect to the vertical direction.

The external connection terminal 140 is electrically connected to the interconnect portion 120, and may be used as a medium for connecting the semiconductor package 100 to an external circuit or another semiconductor package (not shown). For example, one side of the external connection terminal 140 may be connected to the second interconnect layer 123, and the other side of the external connection terminal 140 may be exposed to the outside.

Although a solder ball is illustrated as an example of the external connection terminal 140 in the drawings, the external connection terminal 140 may include a solder bump and the like. The external connection terminal 140 may be formed of a material other than solder.

In addition, the surface of the external connection terminal 140 may be subject to surface-treatment, such as organic coating or metal plating, to prevent the surface of the external connection terminal 140 from being oxidized. For example, the organic material coating may be an Organic Solder Preservation (OSP) coating, and the metal plating may be implemented by plating with gold (Au), nickel (Ni), lead (Pb), silver (Ag), or the like.

The external connection terminal 140 may be connected to the second interconnect layer 123 through the metal dad layer 125. However, this process may be omitted if necessary.

The semiconductor package 100 according to the first embodiment of the present disclosure includes a fan-out structure capable of expanding the active region of the semiconductor chip 110. To this end, the semiconductor package 100 is provided such that a connecting region of the external connection terminal 140 is wider than the active region of the semiconductor chip 110. Here, the connecting region of the external connection terminal 140 refers to a region formed when the external connection terminal 140 located at the outermost is connected, and the active region of the semiconductor chip 110 refers to a region formed when the signal portion 113 located at the outermost is connected.

The semiconductor package 100 according to the first embodiment of the present disclosure may further include a membrane member 150 surrounding the semiconductor chip 110.

The membrane member 150 may be provided to protect the semiconductor chip 110 from the outside. For example, the membrane member 150 is provided to cover the inactive surface 112 and the side portion of the semiconductor chip 110, and the membrane member 150 is provided to cover the side portion of the filling member 130 and the upper surface of the interconnect portion 120. In particular, the filling member 150 may cover the upper portion of the insulating layer 122 to prevent the first interconnect layer 121 from being exposed to the outside.

The semiconductor package 100 according to the embodiment of the present disclosure is provided such that the filling member 130 is filled only between the active surface 111 of the semiconductor chip 110 and the interconnect portion 120, and the inactive surface 112 and the side portion of the semiconductor chip 110 are surrounded by the membrane member 150. In general, the filling member 130 is provided to surround the semiconductor chip 110 to protect the semiconductor chip 110 from the outside. However, the thickness of the filling member 130 causes the overall thickness of the package to increase, and a high temperature heat or pressure generated in the process of sealing the filling member 130a may cause misalignment between the semiconductor chip 110 and the interconnect portion 120.

However, since the membrane member 150 of the semiconductor package 100 according to the embodiment of the present disclosure is a thin membrane for the semiconductor chip 110, slimness of the semiconductor package 100 may be achieved, and a process of forming the membrane member 150 does not cause a misalignment between the semiconductor chip 110 and the interconnect portion 120.

In addition, the membrane member 150 may perform various functions depending on a material forming the membrane member that is selected as necessary. The membrane member 150 may be formed of a material having high thermal conductivity, a material capable of shielding EMI, or a material having high strength or high hardness. As an example, the membrane member 150 may be formed of material including one or more selected from ceramic, plastic, tempered glass, or the like.

Although the membrane member 15 sealing the semiconductor chip 110 is illustrated as a single layer, the membrane member 150 may be implemented by sequentially coating two or more members having different functions. For example, the semiconductor chip 110 may be coated with a material having an EMI shielding function to surround the semiconductor chip 110, and then with a high strength material.

In addition, the thickness of the membrane member 150 is illustrated to be constant in a width direction of the semiconductor package 100. However, the thickness of the membrane member 150 may vary from position to position.

For example, the thickness of a portion of the membrane member 150 surrounding the semiconductor chip 110 may be different from the thickness of a portion of the membrane member 150 covering the interconnect portion 120.

Hereinafter, a process of fabricating the semiconductor package 100 according to the first embodiment will be described with reference to the drawings. FIGS. 2 to 13 are cross-sectional views illustrating a process of fabricating the semiconductor package 100 according to the first embodiment of the present disclosure.

Figure 2:
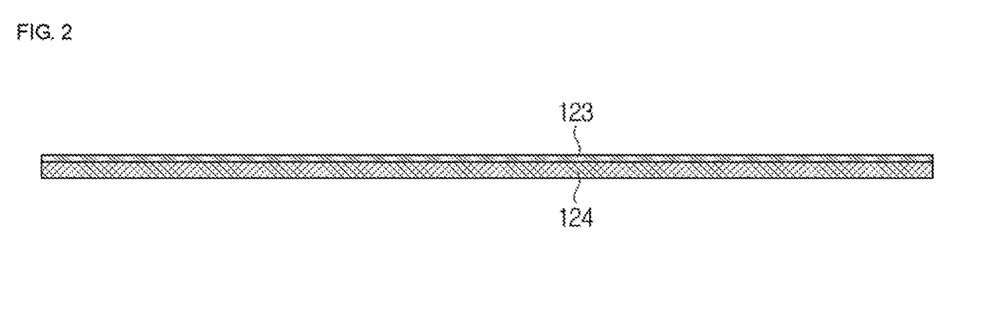
FIG. 2 illustrates a process of preparing a substrate.
Figure 3:
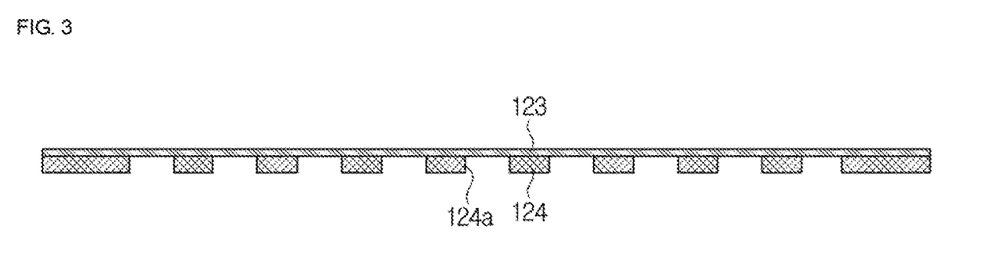
FIG. 3 illustrates a process of machining a via hole.
Figure 4:
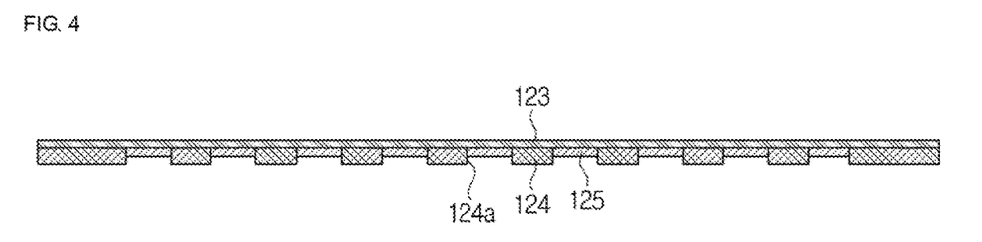
FIG. 4 illustrates a plating process of a metal clad layer.

FIG. 2 illustrates a process of preparing the substrate 124, FIG. 3 illustrates a process of machining the via hole 124a, and FIG. 4 illustrates a plating process of the metal clad layer 125.

Referring to FIG. 2, a printed substrate with the second interconnect layer 123 stacked is prepared on the insulating substrate 124. In this case, the print substrate e may be prepared in a wafer level. The substrate 124 may serve as a support that supports the interconnect portion 120.

Referring to FIG. 3, the blind via hole 124a is machined in the insulating substrate 124. The blind via hole 124a refers to a via hole formed through the insulating substrate 124 while being blocked at one side thereof by the second interconnect layer 123.

Referring to FIG. 4, the metal clad layer 125 is formed in the via hole 124a. The metal clad layer 125 is formed of a conductive material, and may be provided by a metal plating process.

Figure 5:
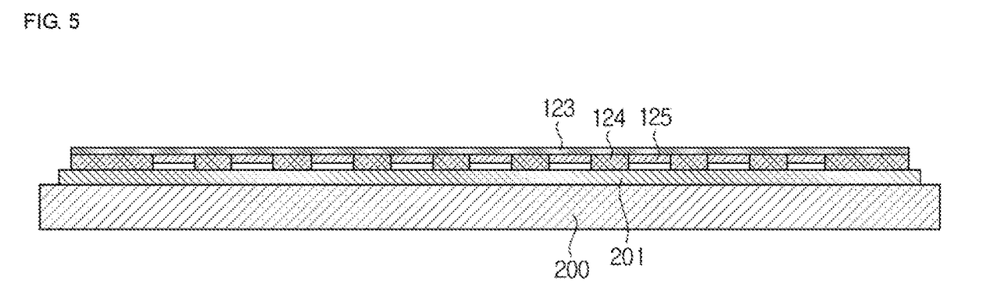
FIG. 5 illustrates a process of attaching to a carrier.
Figure 6:
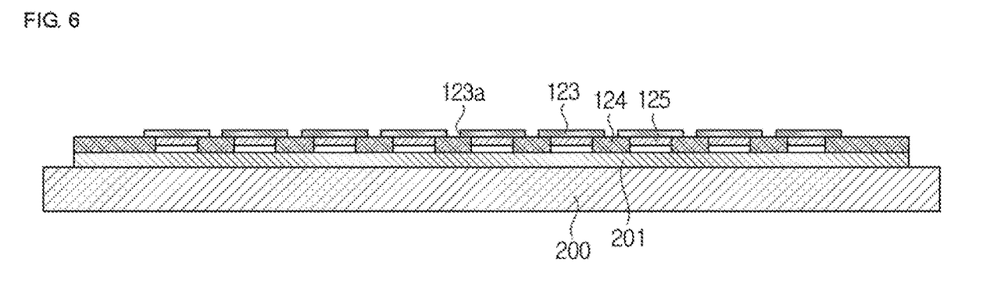
FIG. 6 illustrates a process of forming an interconnect pattern.
Figure 7:
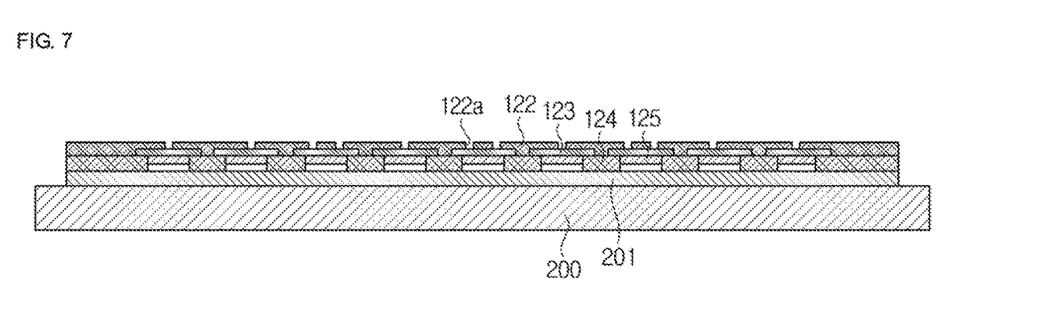
FIG. 7 illustrates a process of forming a first insulating layer.
Figure 8:
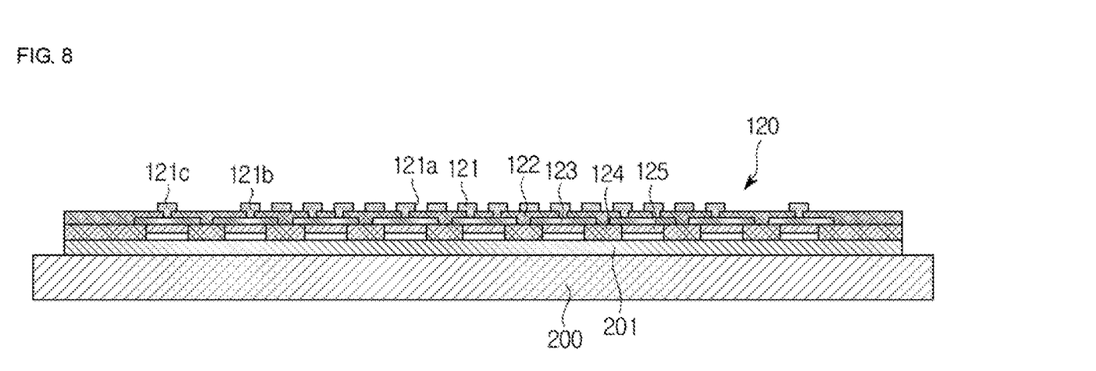
FIG. 8 illustrates a process of forming a first interconnect layer.

FIG. 5 illustrates a process of attaching the prepared substrate to a carrier 200, FIG. 6 illustrates a process of forming an interconnect pattern, FIG. 7 illustrates a process of forming the first insulating layer 122, and FIG. 8 illustrates a process of forming the first interconnect layer 121.

Referring to FIG. 5, the insulating substrate 124 of a wafer level is mounted on the carrier 200. Although only one package is illustrated as being manufactured on one carrier 200 for the sake of convenience in description, a plurality of packages may be simultaneously manufactured on the carrier 200.

The insulating substrate 124 may be mounted on the carrier 200 with the opening of the blind via hole 124a facing downward. The carrier 200 serves to support the interconnect portion 120 and the semiconductor chip 110, and may be formed of a material having a high rigidity and small thermal deformation. The carrier 200 may be a rigid type material. For example, the carrier 20 may formed using a material, such as a molded product or a polyimide tape.

An adhesive layer 201 may be provided on one side of the carrier 200. The adhesive layer 201 may be provided using a double-sided adhesive film, one side of which is fixedly attached to the carrier 200 and the other side of which is attached to the substrate 124.

Referring to FIG. 6, the second interconnect layer 123 may be subject to a metal patterning to thereby form an interconnect pattern. In this case, the interconnect pattern is formed such that the second interconnect layer 123 is connected to the metal clad layer 125. The second interconnect layer 123 may be divided in units of packages in the patterning process. In the drawing, the second interconnect layer 123 at the outside of one package is illustrated as being removed. Accordingly, the second interconnect layer 123 is prevented from being exposed to the outside in a package unit cutting, which is the final process of the manufacturing process.

Referring to FIG. 7, the first insulating layer 122 may be staked on the substrate 124. The first insulating layer 122 is provided to cover the second interconnect layer 123. However, the first insulating layer 122 may include a plurality of openings 122a formed in a region corresponding to the second interconnect layer 123. The opening 122a is a region in which the first interconnect layer 121 is connected to the second interconnect layer 123.

Referring to FIG. 8, the first interconnect layer 121 may be subject to a metal patterning, to thereby form an interconnect pattern. In this case, the interconnect pattern is formed such that the first interconnect layer 121 is connected to the second interconnect layer 123 through the opening 122a of the first insulating layer 122.

The first interconnect layer 121 may be divided into a connection region 121b directly connected to the signal portion 113 of the semiconductor chip 110 and an expansion region 121c that expands the connection region 121b outwardly. In detail, the connection region 121b directly connected to the signal portion 113 of the semiconductor chip 110 in the first interconnect layer 121 corresponds to the active region of the semiconductor chip 110 in which the signal portion 113 is provided, while the expansion region 121c is electrically connected to the connection region 121b while expanding the connection region 121b to the outside of the semiconductor chip 110. That is, the expansion region 121c may form a re-distribution pattern for the fan-out package.

Figure 9:
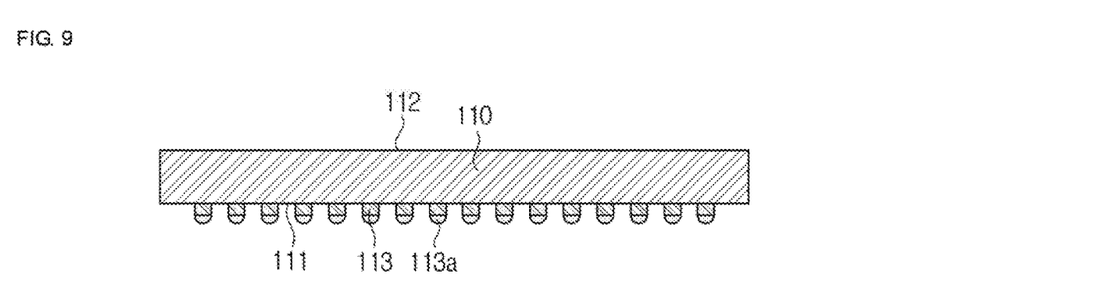
FIG. 9 illustrates a process of preparing a semiconductor chip having a signal portion.
Figure 10:
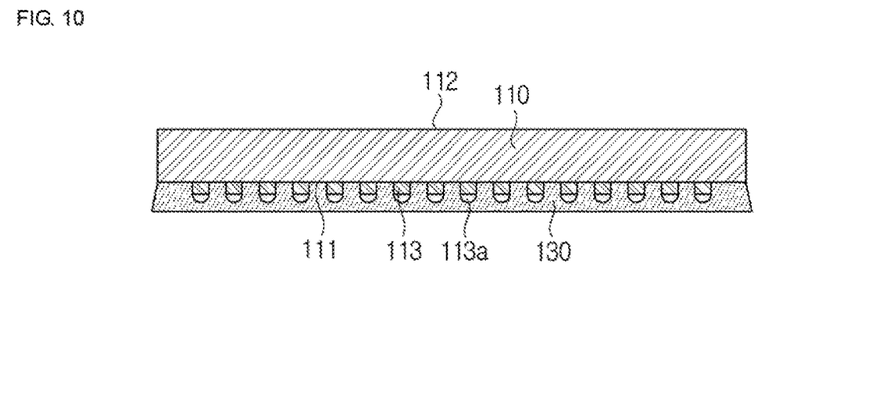
FIG. 10 illustrates a process of molding an active surface.
Figure 11:
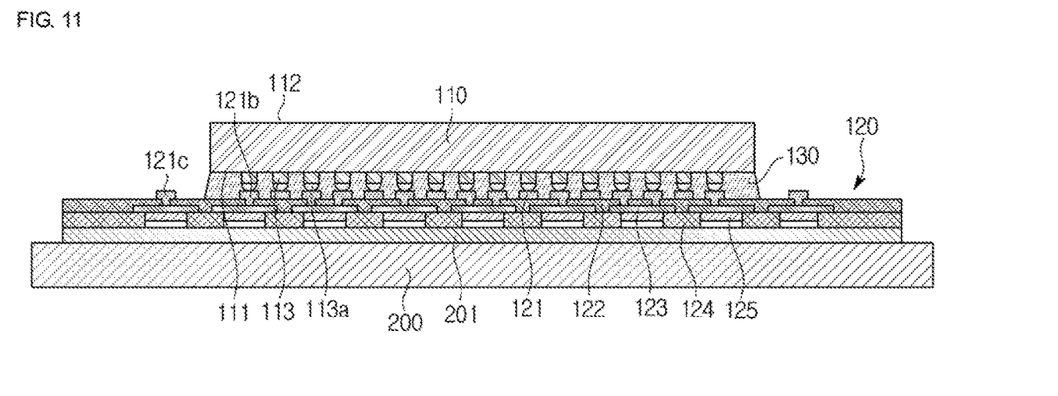
FIG. 11 illustrates a process of bonding a semiconductor chip to a interconnect portion.
Figure 12:
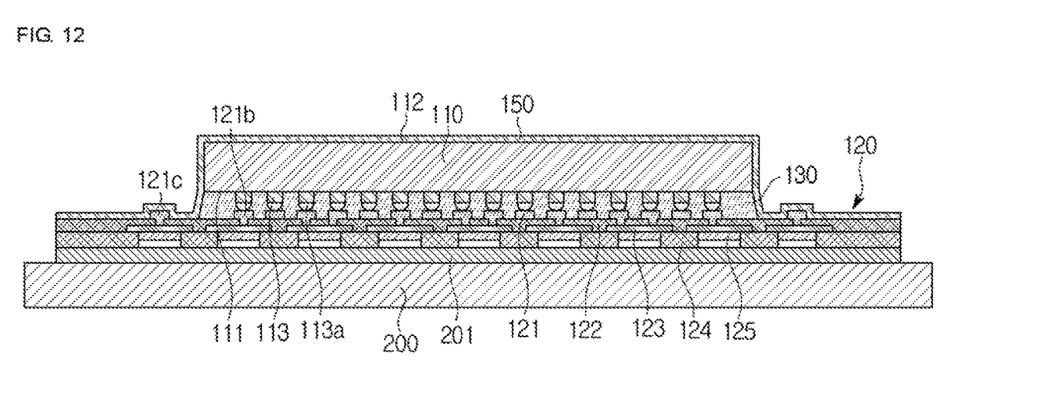
FIG. 12 illustrates a process of forming a membrane member, FIG. 13 illustrate a process of removing a carrier.
Figure 13:
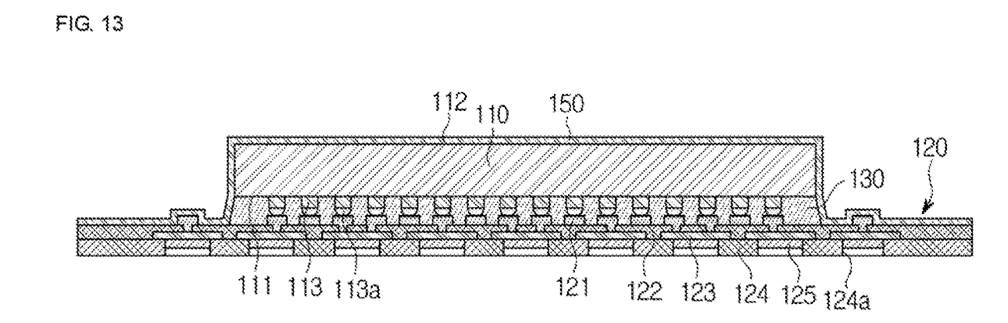
Figure 14:
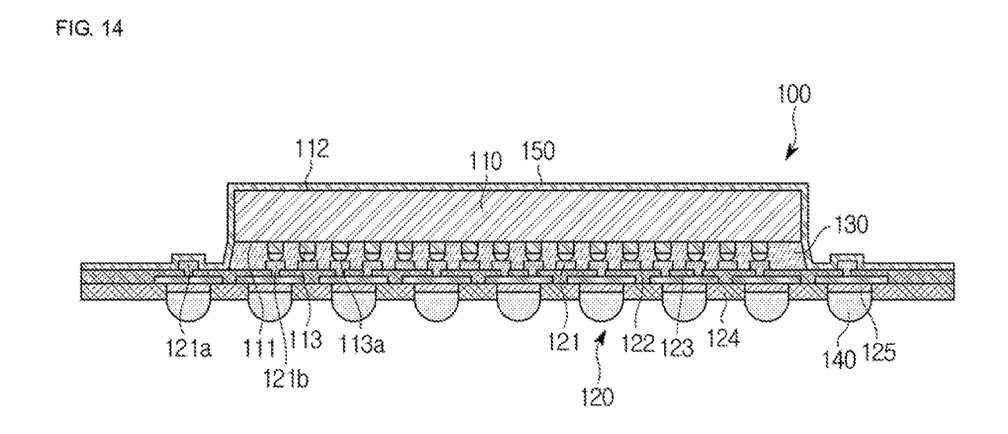
FIG. 14 illustrates a process of attaching an external connection terminal.

FIG. 9 illustrates a process of preparing the semiconductor chip 110 having the signal portion 113, FIG. 10 illustrates a process of molding the active surface 111, FIG. 11 illustrates a process of bonding the semiconductor chip 110 to the interconnect portion 120, FIG. 12 illustrates a process of forming the membrane member 150, FIG. 13 illustrates a process of removing the carrier 200, and FIG. 14 illustrates a process of attaching the external connection terminal 140.

Referring to FIG. 9, the semiconductor chip 110 may be provided with the active surface 111 on one side and the inactive surface 112 on the other side. A plurality of the signal portions 113 may protrude from the active surface 111. The signal portion 113 may be a bump, and may be, for example, a copper pillar bump or a solder bump.

The conductive adhesive material 113a may be applied to the end of the signal portion 113. For example, the conductive adhesive material 113a may be provided as a molten material of metal (including lead (Pb) or tin (Sn)) that enables a solder joint bonding of the signal portion 113 and the first interconnect layer 121.

Referring to FIG. 10, the filling member 130 is provided on the active surface 111 of the semiconductor chip 110, and the filling member 130 may be provided to cover the signal portion 113. Different from the illustration in FIG. 10, the filling member 130 may be provided to cover only a part of the signal portion 113.

The filling member may be molded in the form of an underfill. The filling member 130 may include an insulating material. For example, the filling member 130 may be formed of an epoxy flux paste.

The filling member 130 may be provided in B-stage. Here, B-stage represents a semi-hardened state of a material made by heating, that is, an intermediate state of the curing of a thermosetting resin.

Meanwhile, FIGS. 9 and 10 show the semiconductor chip 110 in a unit of a package for the sake of convenience in description, but the semiconductor chip 110 may be provided at a wafer level. That is, the semiconductor chip 110 may have the signal portion 113 attached thereto and have the filling member 130 underfilled thereon at a wafer level, and then cut in a unit of a package.

Referring to FIG. 11, the semiconductor chip 110 is mounted on the interconnect portion 120. The semiconductor chip 110 may be mounted by a flip chip bonding process.

The bonding process of the semiconductor chip 110 may be performed by thermo compression bonding. At this time, as the filling member 130 provided in the B-stage at a high temperature is semi-cured, the signal portion 113 of the semiconductor chip 110 and the first interconnect layer 121 may be connected to the first interconnect layer 121. In detail, the signal portion 113 and the first interconnect layer 121 may be connected to each other with the conductive adhesive material 113a interposed therebetween.

According to the embodiment of the present disclosure, the filling member 130 is underfilled, and then the semiconductor chip 110 in a unit of a package is flip-chip bonded. Therefore, bubbles that may be generated when the filling member 130 is underfilled after the flip-chip bonding of the semiconductor chip 110 are prevented from being generated, and the electrical stability of the semiconductor chip 110 may be improved.

Referring to FIG. 12, the membrane member 150 is coated to cover the semiconductor chip 110 and the interconnect portion 120.

The membrane member 150 is provided to cover the semiconductor chip 110 to block the semiconductor chip 110 from the outside. As an example, the membrane member 150 may be provided to cover the inactive surface 112 and side portions of the semiconductor chip 110.

In addition, the membrane member 150 may cover the upper portion of the insulating layer 122 to prevent the first interconnect layer 121 from being exposed to the outside. In detail, the membrane member 150 may be provided to cover the expansion region 121c of the first interconnect layer 121. For example, the membrane member 150 may be provided to simultaneously cover the semiconductor chip 110 and the expansion region 121c.

The membrane member 150 may be provided as a membrane having a thickness thinner than a thickness of the semiconductor chip 110. Compared to when sealing the semiconductor chip 110 with the filling member 130 under a high temperature and high pressure process, the membrane member 150 formed by a coating process prevents misalignment between the semiconductor chip 110 and the interconnect portion 120.

In addition, the membrane member 150 may perform various functions depending on a material forming the membrane member 150 that is selected as necessary. The membrane member 150 may be formed of a material having high thermal conductivity, a material capable of shielding EMI, or a material having high strength or high hardness. For example, at least one of ceramic, plastic, tempered glass, or metal may be selected.

Referring to FIG. 13, the carrier 200 may be removed after the membrane member 150 is formed.

After the carrier 200 is removed, the blind via hole 124a of the insulating substrate 124 may be exposed.

Referring to FIG. 14, the external connection terminal 140 may be installed.

The external connection terminal 140 is attached to one surface of the interconnect portion 120 to electrically connect the semiconductor package 100 to the outside. In detail, the external connection terminal 140 may be connected to the metal clad layer 125 exposed through the blind via hole 124a. The outside may refer to an external circuit or another semiconductor package (not shown). Although the solder ball is illustrated as one example of the external connection terminal 140 in the drawing, the external connection terminal 140 may be implemented using a solder bump and the like.

Figure 15:
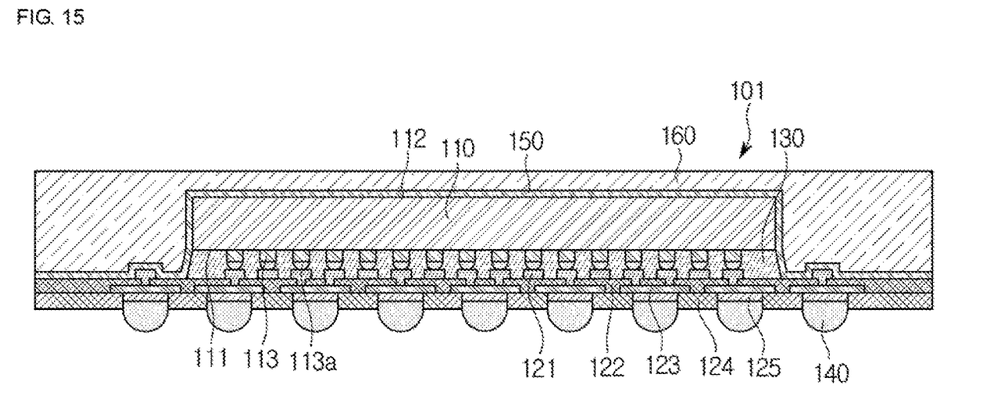
FIG. 15 is a cross-sectional view illustrating a semiconductor package according to the second embodiment of the present disclosure.

FIG. 15 is a cross-sectional view illustrating a semiconductor package 101 according to the second embodiment of the present disclosure.

Upon comparison of FIG. 14 and FIG. 15, the semiconductor package 101 according to the second embodiment of the present disclosure has an encapsulating material 160 molded on the outer side of the membrane member 150 such that the membrane member 150 and the semiconductor chip 110 are protected from the outside.

The encapsulating material 160 may be molded to integrate the semiconductor chip 110 and the interconnect portion 120 together. The encapsulating material 160 may include an insulating material, and may include, for example, an epoxy mold compound (EMC) or an encapsulant.

The encapsulating material 160 may be injected in a state having a fluidity and then cured in a high temperature environment. For example, the method of manufacturing the semiconductor package according to the present disclosure may include heating and pressing the encapsulating material 160. At this time, a vacuum process may be added to remove gas or the like in the encapsulating material 160. As the encapsulating material 160 is cured, the semiconductor chip 110 and the interconnect part 120 are integrated with each other to form a single structure.

The encapsulating material 160 may be provided to surround the entire surface of the membrane member 150. Side portions of the encapsulating material 160, the membrane member 150, and the interconnect portion 120 may form the same plane. After the sealing of the encapsulating material 160, the semiconductor package 101 may have a rectangular cross-section.

When both of the encapsulating material 160 and the membrane member 150 are provided, the encapsulating material 160 and the membrane member 150 may perform different functions from each other. For example, the membrane member 150 may serve to shield EMI, and the encapsulating member 160 may serve to mechanically protect the semiconductor package 101.

Figure 16:
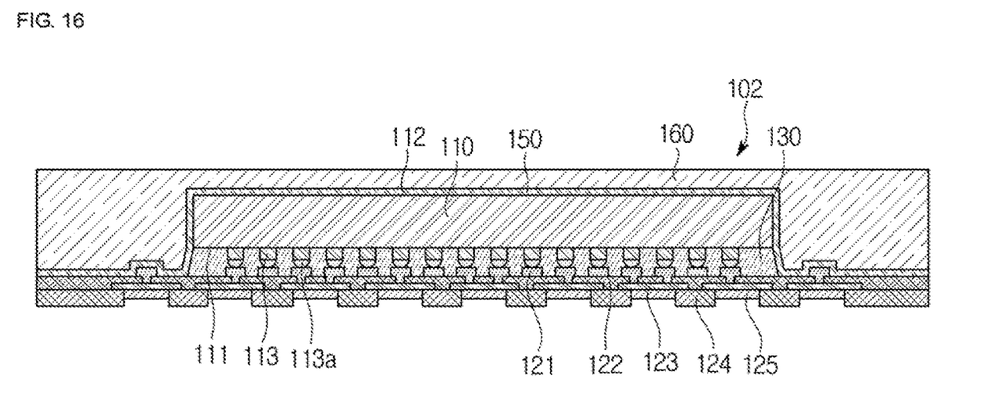
FIG. 16 is a cross-sectional view illustrating a semiconductor package according to the third embodiment of the present disclosure.

FIG. 16 is a cross-sectional view showing a semiconductor package 102 according to the third embodiment of the present disclosure.

Upon comparison of FIG. 15 and FIG. 16, the semiconductor package 102 according to the third embodiment of the present disclosure may omit the external connection terminal 140. When the external connection terminal 140 is omitted, the metal clad layer 125 may be exposed to the outside through the blind via hole 124a of the insulating substrate. Alternatively, the metal clad layer 125 may be omitted and the second interconnect layer 123 may be exposed to the outside.

Figure 17:
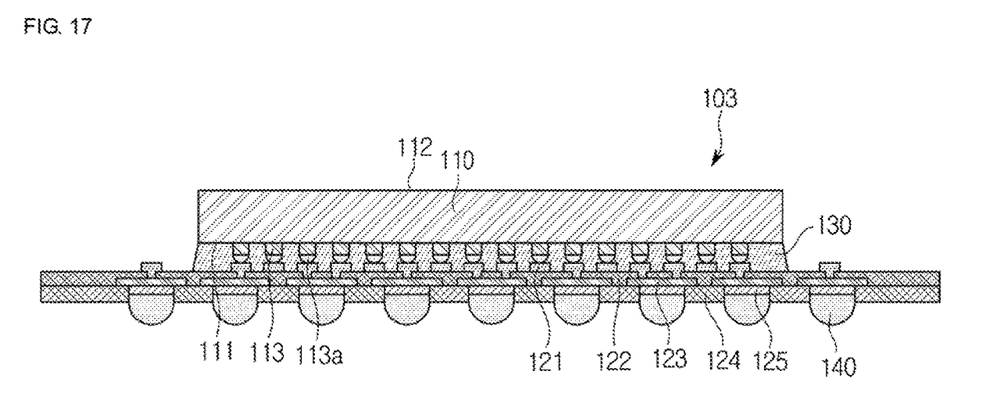
FIG. 17 is a cross-sectional view illustrating a semiconductor package according to the fourth embodiment of the present disclosure.

FIG. 17 is a cross-sectional view showing a semiconductor package 103 according to the fourth embodiment of the present disclosure.

Upon comparison of FIG. 14 and FIG. 17, the semiconductor package 103 according to the fourth embodiment of the present disclosure may omit the membrane member 150.

The membrane member 150 may be omitted when the semiconductor package 103 is free from external impact or contamination. Even in this case, since the filling member 130 is underfilled on a connection portion between the semiconductor chip 110 and the interconnect portion 120, the electrical connection of the semiconductor chip 110 is stable.

As is apparent from the above, the semiconductor package and the method of manufacturing the same can cope with a fine pitch of pads by preventing a die drift that occurs in a process of bonding a semiconductor chip.

In which an interconnect portion is formed by applying an interconnect routing process to a low priced core substrate, so that a micro pattern substrate may be manufactured at a low cost compared to the conventional build-up process in which an insulating layer and an interconnect layer are stacked on one surface of a semiconductor package, and thus the product cost can be reduced.

In addition, the semiconductor package and the method of manufacturing the same can simplify the manufacturing process and lower the manufacturing cost of the substrate compared to the generally used printed circuit board (PCB) by using a core substrate.

The semiconductor package and the method of manufacturing the same can improve the productivity by forming and packaging an interconnection in a panel level rather than in a chip level.

The semiconductor package and the method of manufacturing the same can reduce the material cost and the manufacturing process cost by performing packaging using a single a carrier, compared to the conventional technology in which a carrier for mounting a semiconductor chip and a carrier for forming an interconnect portion are separately used.

The semiconductor package and the method of manufacturing the same can mechanically protect the semiconductor chip, shield EMI, or dissipate heat by coating a semiconductor chip with a membrane member having various functions.

The above description of the present disclosure is for illustrative purposes, and a person having ordinary skilled in the art should appreciate that other specific modifications may be easily made without departing from the technical spirit or essential features of the present disclosure. Therefore, the above embodiments should be regarded as illustrative rather than limitative in all aspects. The scope of the disclosure is not to be limited by the detailed description set forth above, but by the accompanying claims of the present disclosure, and it should also be understood that all changes or modifications derived from the definitions and scope of the claims and their equivalents fall within the scope of the present disclosure.

What is claimed is:

1. A method of manufacturing a semiconductor package, the method comprising:
   forming an interconnect portion including an interconnect layer and an insulating layer;
   preparing a semiconductor chip having an active surface thereof underfilled by a filling member such that a bump protruding from the active surface is sealed;
   mounting the semiconductor chip on the interconnect portion such that the bump is connected to the interconnect layer by thermo compression bonding and
   coating the semiconductor chip and interconnect layer with a membrane member to seal said semiconductor chip and interconnect layer,
   wherein the forming of the interconnect portion comprises:
   preparing an insulating substrate including a second insulating layer and a patterned second interconnect layer stacked on the second insulating layer in which the second insulating layer is formed with a plurality of blind via holes that expose the second interconnect layer;

disposing the insulating substrate on a carrier such that the blind via holes face the carrier;

forming a metal clad layer inside the blind via hole to be connected to the second interconnect layer before disposing the substrate on the carrier;

removing the carrier after sealing of the membrane member; and attaching an external connection terminal to the metal clad layer that is exposed when the carrier is removed.

2. The method of claim 1, wherein the forming of the interconnect portion comprises:

stacking a first insulating layer the second insulating layer while exposing a part of the pattern of the second interconnect layer after disposing the substrate on the carrier; and forming a first interconnect layer connected to the second interconnect on the first insulating layer, wherein the bump is connected to the first interconnect layer.

3. The method of claim 2, wherein the filling member is underfilled in a state of B-stage, and is cured after the semiconductor chip is mounted on the interconnect portion.

4. The method of claim 1, wherein:

the semiconductor chip is cut into package units after the filling member is underfilled in a wafer level; and the semiconductor chip cut into package units is mounted on the interconnect portion.

\* \* \* \* \*